United States Patent [19]

Ichihashi

[11] Patent Number: 6,137,287

[45] Date of Patent: Oct. 24, 2000

[54] PHYSICAL PARAMETER SENSOR HAVING A SELF-TESTING CIRCUIT WHICH RECOGNIZES AN ABNORMAL SENSOR STATE

[75] Inventor: Motomi Ichihashi, Tokyo, Japan

[73] Assignee: Mitsubishi Denki Kabushiki Kaisha, Tokyo, Japan

[21] Appl. No.: 09/031,673

[22] Filed: Feb. 27, 1998

[30] Foreign Application Priority Data

Jun. 27, 1997 [JP] Japan .................................. 9-171599

[51] Int. Cl.$^7$ ...................................................... G01P 3/48
[52] U.S. Cl. ...................... 324/160; 324/207.12; 327/42; 327/4
[58] Field of Search ................................. 324/160, 163, 324/166, 173, 174, 175, 202, 207.11–207.25; 327/3, 4, 7, 39–49

[56] References Cited

U.S. PATENT DOCUMENTS 5,686,835  11/1997  Watanabe et al. ...................... 324/166
5,736,852  4/1998  Pattantyus ............................... 324/166

FOREIGN PATENT DOCUMENTS

| 42 27113 A1 | 2/1994 | Germany . |
| 43 22897 A1 | 1/1995 | Germany . |
| 4-102326 | 9/1992 | Japan . |
| 6-229778 | 8/1994 | Japan . |
| 63-255601 | 10/1998 | Japan . |

Primary Examiner—Jay Patidar

[57] ABSTRACT

A sensor for detecting a physical parameter is capable of detecting an error state in which normal physical parameter detection is not possible even though the output voltage is within a normal output voltage range is disclosed. Errors such as a normal reference frequency signal not being output from an oscillation circuit for some reason, or the frequency of the reference frequency signal output from the oscillation circuit not being within a particular frequency range, can occur. The physical parameter sensor of the invention comprises a self-testing circuit for detecting such error states, and outputting a signal indicating such error detection.

14 Claims, 8 Drawing Sheets

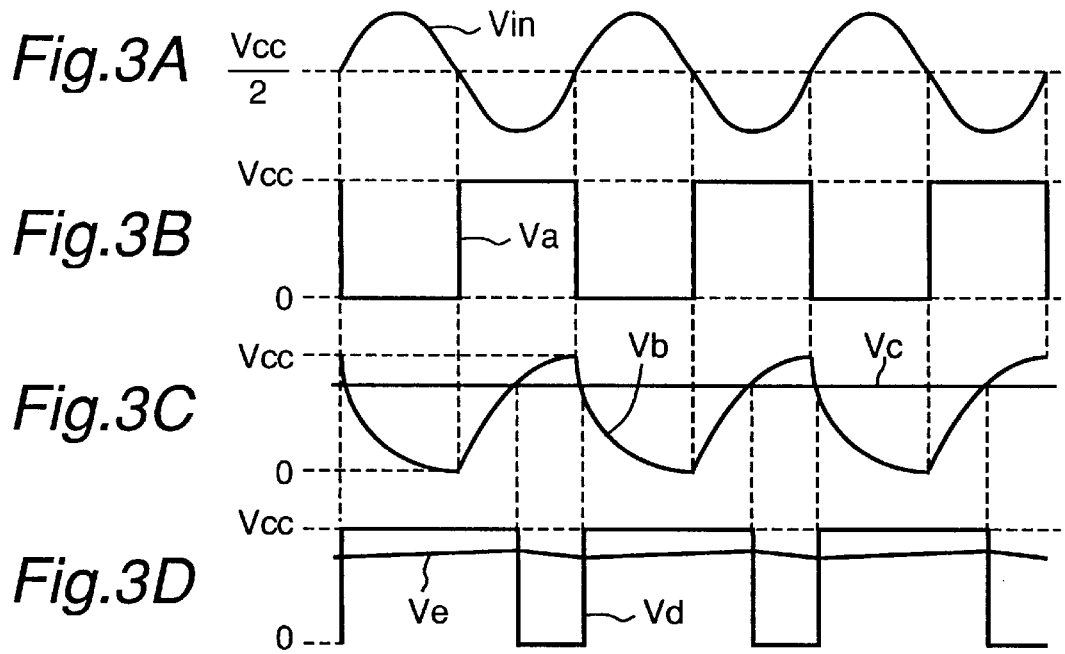
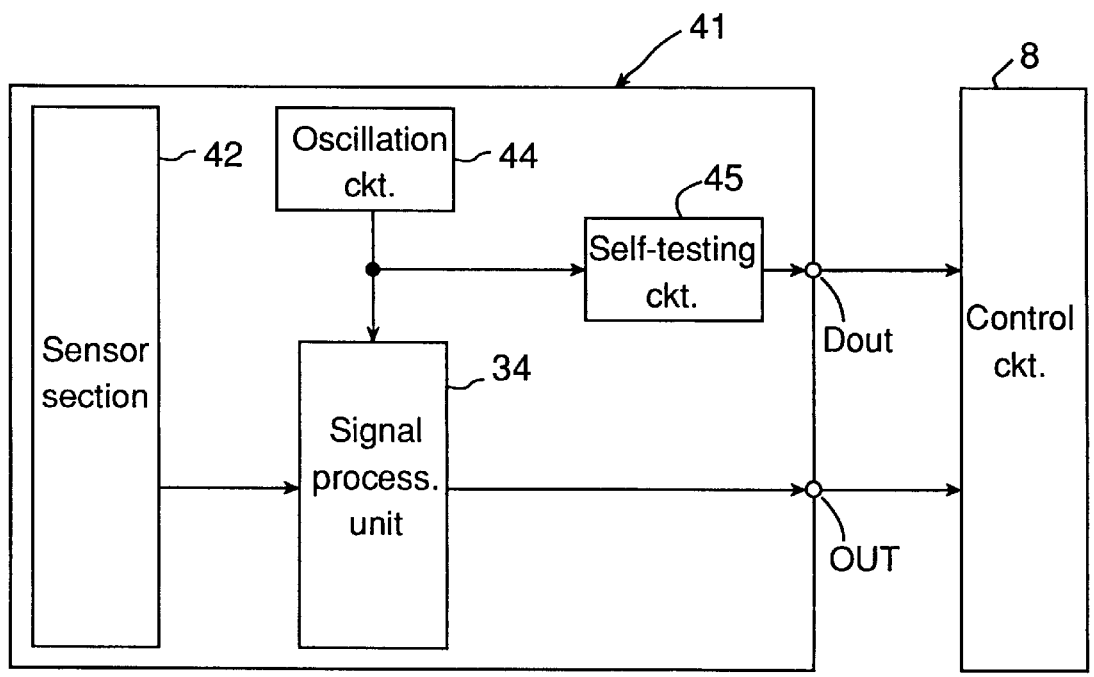

PHYSICAL PARAMETER SENSOR HAVING A SELF-TESTING CIRCUIT WHICH RECOGNIZES AN ABNORMAL SENSOR STATE

BACKGROUND OF THE INVENTION

1. Field of the Invention

The present invention relates to a physical parameter sensor for detecting such physical quantities as acceleration, angular velocity, and pressure, and relates more particularly to a physical parameter sensor for processing a signal in reference to a reference frequency.

2. Description of the Prior Art

FIG. 11 is a block diagram of the prior art physical parameter sensor for detecting angular velocity. As shown in FIG. 11, this physical parameter sensor 200 comprises a sensor circuit 201, a signal detection circuit 202, a signal processing circuit 203, and an oscillation circuit 204.

The oscillation circuit 204 generates a sine wave signal having a particular reference frequency, and outputs this reference frequency signal to the sensor circuit 201 and to the signal detection circuit 202. The sensor circuit 201 operates based on the frequency of this reference frequency signal, inputted from the oscillation circuit 204, to convert a detected physical quantity into an electric signal. A signal indicative of the detected physical quantity is then outputted from the sensor circuit 201 to the signal detection circuit 202.

The signal detection circuit 202 amplifies this signal indicative of the detected physical quantity and then rectifies the amplified signal to output a direct current (DC) signal. The resulting DC physical quantity signal is supplied to the signal processing circuit 203. It should be noted that the signal detection circuit 202 utilizes the reference frequency signal, which has been supplied from the oscillation circuit 204, when rectifying the physical quantity signal to the DC signal.

The signal processing circuit 203 processes the DC signal to compensate for a temperature-dependent change of the DC signal from the signal detection circuit 202 and then amplifies the compensated signal. The amplified signal is outputted from the signal processing circuit 203 as an output signal of the physical parameter sensor 200 through an output terminal OUT. The output signal from the physical parameter sensor 200 is subsequently supplied to a control circuit 8 which typically may be a microcontroller or any other semiconductor device, used to execute a particular process based on the signal inputted from the physical parameter sensor 200.

The output signal from the signal processing circuit 203, i.e., the output signal from the physical parameter sensor 200, is called an "offset output" when the detected physical parameter is 0. This offset output is set to Vcc/2 where Vcc represents the voltage of a direct current power source. Accordingly, when the reference frequency signal is not supplied from the oscillation circuit 204 to the sensor circuit 201 for some reason, the level of the signal inputted from the sensor circuit 201 to the signal detection circuit 202 is 0 and, therefore, the output signal from the signal processing circuit 203 is Vcc/2.

Consequently a voltage within the normal output voltage range will be outputted from the output terminal OUT of the physical parameter sensor 200 even when the sensor circuit 201 is unable to detect the desired physical parameter because of some problem in the oscillation circuit 204 or breakage of an internal wiring of the physical parameter sensor 200. In other words, the prior art physical parameter sensor 200 has no self-testing capability.

SUMMARY OF THE INVENTION

The present invention has been devised to substantially eliminate the above discussed problem inherent in the prior art physical parameter sensor and is intended to provide an improved physical parameter sensor capable of self-detecting an abnormal state in the physical parameter sensor which would otherwise be difficult to detect, even though the voltage outputted from the parameter sensor falls within the normal output voltage range.

A physical parameter sensor for detecting at least one physical parameter according to the present invention comprises a sensor circuit for converting a physical parameter into an electric signal; an oscillation circuit for generating and outputting a signal of a particular frequency; a signal processing unit operable to perform a predetermined process on the electric signal based on the signal from the oscillation circuit; and a self-testing circuit for monitoring the signal outputted from the oscillation circuit and for outputting a predetermined error signal when an error in the oscillation circuit output signal is detected.

The sensor circuit may be so configured as to operates in response to the signal outputted from the oscillation circuit. In either case, the self-testing circuit preferably includes a wave shaping circuit for shaping a signal output from the oscillation circuit; a frequency-voltage conversion circuit for converting the frequency of the signal shaped by the wave shaping circuit into a DC voltage; and an error determination circuit for determining the presence or absence of an error in a signal output from the oscillation circuit in reference to the DC voltage converted by the frequency-voltage conversion circuit and for outputting the result of said determination.

According to the present invention, whether only the signal processing unit of the physical parameter sensor operates according to the output signal from the oscillation circuit, or whether the sensor circuit and signal processing unit operate according to the output signal from the oscillation circuit, the self-testing circuit can detect an error in the oscillation circuit output signal and then outputs an error signal when the signal of the particular frequency that should be output from the oscillation circuit is not outputted, or the frequency of the output signal is not within a predetermined range. It is therefore possible to detect an error state in which normal physical parameter detection is not possible even though a voltage in the normal voltage range is outputted from the output terminal of the physical parameter sensor or, more specifically, from the signal processing unit.

Preferably, the frequency-voltage conversion circuit may include a frequency conversion circuit for converting change in frequency of an input signal to a duty cycle change; and a rectification circuit for rectifying a signal converted by the frequency conversion circuit.

Also, the wave shaping circuit is preferably of a type capable of shaping a signal output from the oscillation circuit to a rectangular wave, in which case the frequency-voltage conversion circuit may further include a circuit rendering the output of the frequency conversion circuit to be low when the signal level of the signal wave-shaped by the wave shaping circuit is low. In such case, the magnitude of change of the duty cycle of the output signal from the frequency conversion circuit relative to the change in frequency of the signal outputted from the oscillation circuit can be increased to such an extent as to increase the sensitivity of the frequency-voltage conversion circuit. For this reason, even though the output signal from the oscillation circuit undergoes a slight change, even this slight change can be detected to thereby increase the reliability of the physical parameter sensor.

The self-testing circuit may further include a power-on reset circuit for outputting said error detection signal for a predetermined time when power is initially supplied. The use of the power-on reset circuit makes it possible to allow the error signal to be forcibly outputted for a predetermined time at the time the physical parameter sensor is powered on. For this reason, it is possible to conduct a test to determine if an external circuit operable to perform a predetermined process based on the signal outputted from the physical parameter sensor after the physical parameter sensor has been powered on, at the time the self-testing circuit detects an error in the output signal from the oscillation circuit.

Preferably, the self-testing circuit may further include one or both of an output error detection circuit for monitoring an output signal from the signal processing unit and for outputting a particular error detection signal when an error in said monitored signal is detected, and an output error detection circuit for monitoring a signal processed by the signal processing unit and for outputting a particular error detection signal when an error in the monitored signal is detected. This circuit design is effective to detect not only the error in the signal outputted from the oscillation circuit, but also an error in the output signal from one or both of the signal processing units. By way of example, even where the output of the signal processing unit is coupled with a clamp circuit through, for example, an external circuit, it is possible to detect an error other than the error in the output from the oscillation circuit, thereby further increasing the reliability of the physical parameter sensor.

BRIEF DESCRIPTION OF THE DRAWINGS

The present invention will become readily understood from the following description of preferred embodiments thereof made with reference to the accompanying drawings, in which like parts are designated by like reference numeral and in which:

FIGS. 3A, 3B, 3C and 3D are timing charts used to describe the operation of the self-testing circuit shown in FIG. 2;

FIG. 4 is a block diagram of a modified form of the physical parameter sensor according to the first embodiment of the present invention;

DETAILED DESCRIPTION OF THE PREFERRED EMBODIMENTS (First Embodiment—FIGS. 1 to 4)

Figure 1:
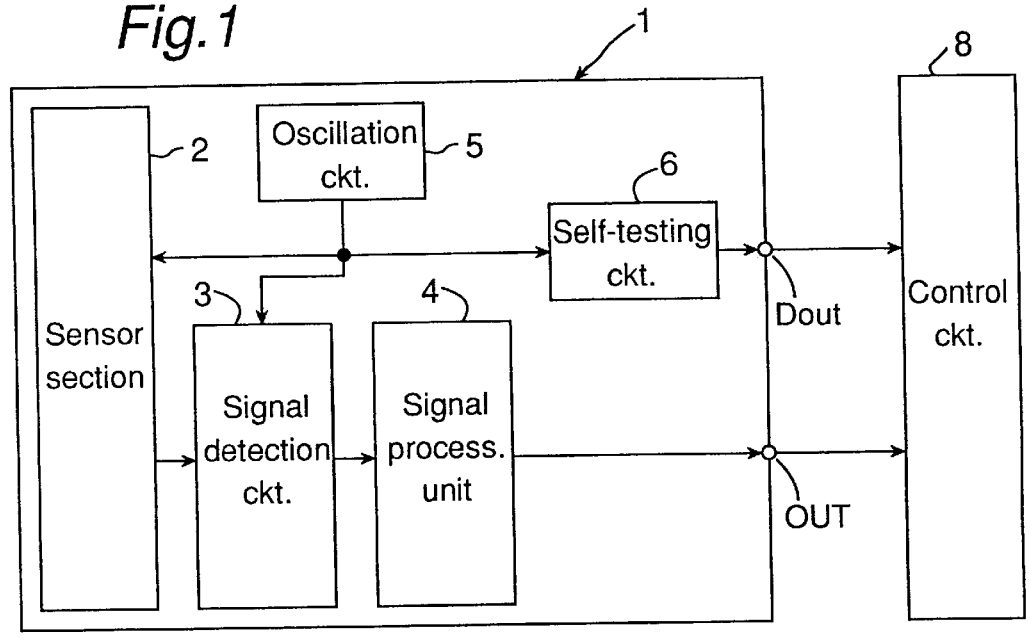
FIG. 1 is a block diagram of a physical parameter sensor according to a first embodiment of the present invention.

Referring to FIG. 1, there is shown a block diagram of a physical parameter sensor according to a first embodiment of the present invention. It should be noted that the physical parameter sensor according to the first embodiment will be described by way of an angular velocity sensor having a sensor circuit operable based on a reference frequency signal to detect the angular velocity.

As shown in FIG. 1, the physical parameter sensor, identified by 1, comprises a sensor circuit 2, a signal detector 3, a signal processing circuit 4, an oscillation circuit 5, and a self-testing circuit 6. The oscillation circuit 5 is connected to the sensor circuit 2, signal detector 3, and self-testing circuit 6. The sensor circuit 2 is connected to the signal detector 3, and the signal detector 3 is connected to the signal processing circuit 4. An output signal from the signal processing circuit 4 and an output signal from the self-testing circuit 6 are passed through output terminals Dout and OUT, respectively, of the physical parameter sensor 1, and are then supplied to a control circuit 8. The control circuit 8 may be a microcontroller or any other semiconductor device for implementing a particular process based on the signals supplied thereto from the physical parameter sensor 1.

The oscillation circuit 5 generates a sine wave signal of a particular reference frequency and outputs this reference frequency signal to the sensor circuit 2, signal detector 3, and self-testing circuit 6.

The sensor circuit 2 operates based on the frequency of this reference frequency signal inputted from the oscillation circuit 5 to convert a detected physical quantity into an electric signal. The electric signal indicative of the detected physical parameter is outputted from the sensor circuit 2 to the signal detector 3.

The signal detector 3 amplifies the signal from the sensor circuit 2 and then rectifies the amplified signal to output a DC signal to the signal processing circuit 4. It should be noted that the signal detector 3 makes use of the reference frequency signal supplied from the oscillation circuit 5 when rectifying the physical quantity signal to a DC signal.

The signal processing circuit 4 further amplifies the signal from the signal detector 3 and then compensates for a temperature-dependent change of the amplified signal. The amplified signal is outputted from the signal processing circuit 4 as the output signal of the physical parameter sensor 1 through the output terminal OUT to the control circuit 8. The output signal from the physical parameter sensor 1 is called an "offset output" when the physical parameter detected by the physical parameter sensor 1 is 0. This offset output is set to Vcc/2 where Vcc represents the voltage of a direct current power source.

The self-testing circuit 6 monitors the reference frequency signal output from the oscillation circuit 5 to detect whether the frequency of the reference frequency signal is within a predetermined acceptable range. Note that the signal detector 3 and the signal processing circuit 4 together constitute a signal processor.

Figure 2:
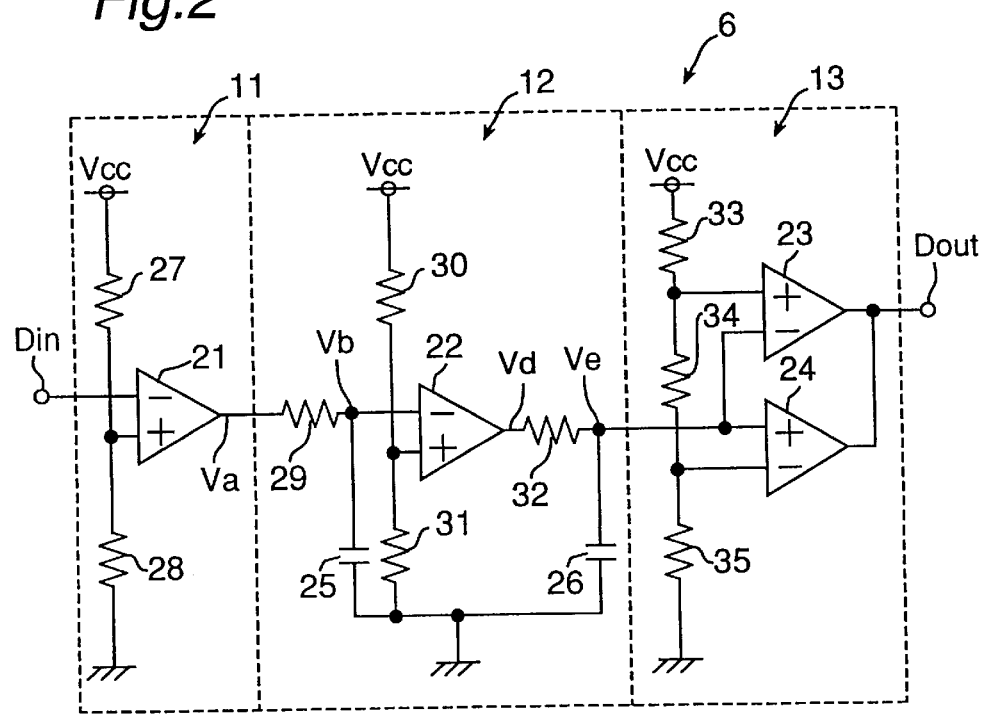
FIG. 2 is a circuit diagram of a self-testing circuit shown in FIG. 1.

FIG. 2 illustrates the details of the self-testing circuit 6. As shown in FIG. 2, the self-testing circuit 6 comprises a wave shaping circuit 11, a frequency-voltage conversion circuit 12, and an error determination circuit 13. The wave shaping circuit 11 includes a comparator 21 and resistors 27 and 28. The frequency-voltage conversion circuit 12 includes a comparator 22, capacitors 25 and 26, and resistors 29 to 32. The error determination circuit 13 includes comparators 23 and 24, and resistors 33 to 35. Note that the comparator 22, capacitor 25, and resistors 29 to 31 together constitute a frequency conversion circuit, and capacitor 26 and resistor 32 form a rectification circuit.

Three series-connected circuits are connected between the DC power supply voltage Vcc and the ground: a first series-connected circuit including resistors 27 and 28 connected in series with each other; a second series-connected circuit including resistors 30 and 31 connected in series with each other; and a third series-connected circuit including resistors 33 to 35 connected in series with each other.

The line between the resistors 27 and 28 of the first series-connected circuit is connected to a non-inverting input of the comparator 21. Note that a predetermined voltage, e.g., DC power supply voltage Vcc/2, is applied to the non-inverting input. An inverting input of the comparator 21 functions as an input terminal of the self-testing circuit 6 and is connected to the oscillation circuit 5 for receiving the reference frequency signal from the oscillation circuit 5. An output of the comparator 21 is passed through a low-pass filter, formed by a capacitor 25 and resistor 29, to the inverting input of the comparator 22 in the frequency-voltage conversion circuit 12.

The line between the resistors 30 and 31 of the second series-connected circuit is connected to a non-inverting input of the comparator 22. An output of this comparator 22 is passed through a low-pass filter, formed by a capacitor 26 and resistor 32, and is then applied to an inverting input of comparator 23 and an non-inverting input of comparator 24 in the error determination circuit 13. The comparators 23 and 24 form a window comparator. The line between resistors 33 and 34 in the third series-connected circuit is connected to the non-inverting input of comparator 23, and the line between resistors 34 and 35 is connected to an inverting input of comparator 24. The outputs of both comparators 23 and 24 are connected to a common line that functions as the output terminal Dout of the self-testing circuit 6, and are therefore connected to the control circuit 8.

It should be noted that the inverting input of the comparator 21 that serves as an input terminal of the self-testing circuit 6 is hereinafter referred to as an input terminal Din, and the common output terminal of the comparators 23 and 24 serving as an output terminal of the self-testing circuit 6 is hereinafter referred to as an output terminal Dout.

In the circuit structure as hereinabove described, the reference frequency signal of a sine-wave form inputted to the input terminal Din is shaped to a rectangular wave by the wave shaping circuit 11. Change in frequency in the shaped signal is converted to a change in duty cycle by the frequency-voltage conversion circuit 12 and is then rectified to a DC signal, converting the signal frequency to a DC voltage. A signal repeatedly charged and discharged based on the time constant of the low-pass filter formed by the capacitor 25 and resistor 29 is inputted to the inverting input of the comparator 22 at this time, and a signal repeatedly charged and discharged based on the time constant of the low-pass filter formed by the capacitor 26 and resistor 32 is inputted to the common junction between the inverting input of comparator 23 and the non-inverting input of comparator 24.

The time constant of the low-pass filter formed by the capacitor 26 and the resistor 32 is set great enough to cause the signal inputted to the common junction between the inverting input of comparator 23 and the non-inverting input of comparator 24 to approach a DC signal. With the circuit configuration shown in FIG. 2, the voltage of the signal outputted from the frequency-voltage conversion circuit 12 increases as the frequency of the signal inputted to the input terminal Din rises. The error determination circuit 13 then determines whether the voltage of the signal converted by the frequency-voltage conversion circuit 12 is within a particular voltage range. The result of this evaluation is outputted from the output terminal Dout in the form of a binary signal.

FIGS. 3A to 3D are timing charts used to describe the operation of the self-testing circuit 6 shown in FIG. 2. Referring to these figures, a waveform (3A) represents the reference frequency signal Vin inputted to the input terminal Din of the self-testing circuit 6; a waveform (3B) represents the output signal Va of the comparator 21; a waveform (3C) represents the input signal Vb to the inverting input and the input signal Vc to the non-inverting input of comparator 22; and a waveform (3D) represents the output signal Vd of comparator 22 and the output signal Ve of the low-pass filter consisting of capacitor 26 and resistor 32, i.e., the input signal to the common junction between the inverting input of comparator 23 and the non-inverting input of comparator 24.

The output signal Ve of the waveform (3D) is inputted to the window comparator formed by comparators 23 and 24. The voltage of this input signal is compared with a threshold voltage set by the resistors 33 to 35. When the voltage of the output signal Ve is a voltage other than the reference voltage, a signal indicating an error is outputted from the output terminal Dout to the control circuit 8. Note that in this embodiment a low level signal is used for this error signal. When this error signal is inputted to the control circuit 8, the control circuit 8 ignores the signal inputted from the signal processing circuit 4, and executes a particular process associated with the detected error signal.

It should be noted that the physical parameter sensor according to the present invention has been used as the angular velocity sensor having the sensor circuit operating based on a reference frequency signal. However, as hereinafter described with reference to FIG. 4, the physical parameter sensor according to the present invention can have a sensor circuit which does not operate based on the reference frequency signal.

FIG. 4 is a block diagram of a physical parameter sensor according to a modified form of the first embodiment. Since the sensor circuit shown in FIG. 4 does not operate based on the reference frequency signal, the physical parameter sensor utilizing such sensor circuit can be used as, for example, an acceleration sensor for detecting acceleration. Note that like parts in FIG. 1 and FIG. 4 are identified by like reference numerals, and further description thereof is omitted below.

Referring to FIG. 4, the physical parameter sensor 41 shown therein comprises a sensor circuit 42, a signal processing circuit 43, an oscillation circuit 44, and a self-testing circuit 45. The oscillation circuit 44 is connected to the signal processing circuit 43 and self-testing circuit 45, and the sensor circuit 42 is connected to the signal processing circuit 43.

An output signal from the signal processing circuit 43 and an output signal from the self-testing circuit 45 are passed through output terminals OUT and Dout, respectively, of the physical parameter sensor 41, and are then supplied to the control circuit 8. The control circuit 8 may be a microcontroller or any other semiconductor device for implementing a particular process based on the signals inputted thereto from the physical parameter sensor 41.

It should be noted that in the modification shown in FIG. 4 the signal processing circuit 43 constitutes the signal processor.

The oscillation circuit 44 generates a rectangular wave signal of a particular reference frequency, and outputs this reference frequency signal to the signal processing circuit 43 and self-testing circuit 45.

The signal processing circuit 43 operates based on the reference frequency signal inputted from the oscillation circuit 44, and generates the output signal which is subsequently passed from the output terminal OUT of the physical parameter sensor 41 to the control circuit 8. The signal processing circuit 43 compensates for a temperature-dependent change of the DC signal inputted from the sensor circuit 42, and then amplifies the compensated signal prior to being outputted to the control circuit 8 through the output terminal OUT of the physical parameter sensor 41.

The self-testing circuit 45 monitors the reference frequency signal outputted from the oscillation circuit 44 to detect whether the frequency of the reference frequency signal is within a particular range. Note that the design of the self-testing circuit 45 is identical to the self-testing circuit 6 shown in FIG. 2, and therefore no further description thereof will be reiterated for the sake of brevity.

As discussed above, the physical parameter sensor according to the first embodiment of the present invention includes a self-testing circuit for detecting an error state and outputting a signal indicating of the error which has been detected when for some reason a reference frequency signal cannot be outputted from an oscillation circuit, or the frequency of the reference frequency signal outputted from an oscillation circuit is not within a particular range. By so doing, it is also possible to detect error states in which a physical parameter cannot be correctly detected even though a voltage within the normal range is outputted from the output terminal OUT of the physical parameter sensor. As a result, the reliability of the physical parameter sensor can be increased.

Figure 5:
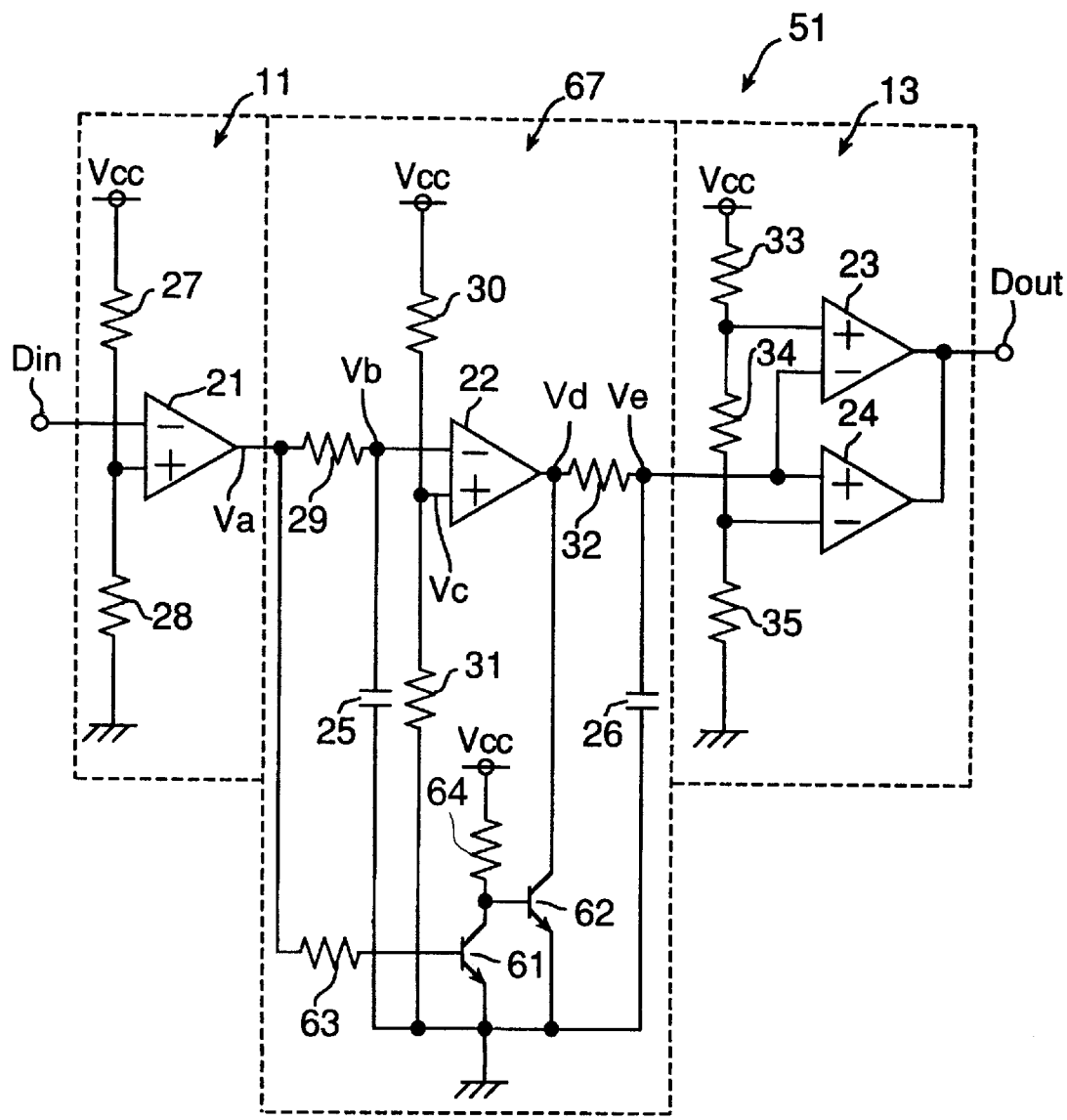
FIG. 5 is a circuit diagram of the self-testing circuit used in the physical parameter sensor according to a second embodiment of the present invention.
Figure 6:
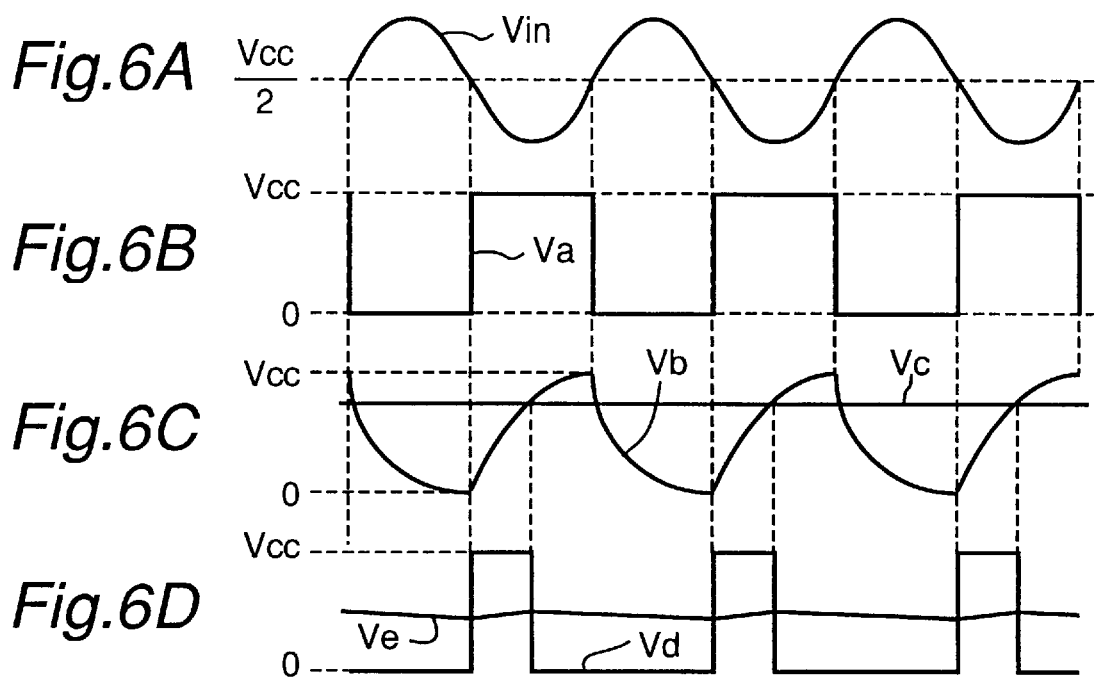
FIGS. 6A, 6B, 6C and 6D are timing charts used to describe the operation of the self-testing circuit shown in FIG. 5.

(Second Embodiment—FIGS. 5 and 6)

A physical parameter sensor according to a second embodiment of the present invention differs from the first embodiment described above in that the self-testing circuit is modified so as to increase the change in the output signal relative to the change in frequency of the reference frequency signal inputted thereto.

In the second embodiment of the present invention, the physical parameter sensor identified by 1 in the foregoing embodiment is identified by 55 and the self-testing circuit identified by 6 in the foregoing embodiment is identified by 51. All other component parts are identified by the same reference numerals.

FIG. 5 is a circuit diagram of the self-testing circuit 51 employed in the sensor according to this second embodiment. Note that this self-testing circuit 51 differs from that shown in FIG. 2 in that npn-type transistors 61 and 62 and resistors 63 and 64 are added to the frequency-voltage conversion circuit 12 of the self-testing circuit 6 in FIG. 2, and consequent upon this change, the frequency-voltage conversion circuit shown in FIG. 5 is identified by 67.

Referring to FIG. 5, the output of the comparator 21 is passed through the resistor 63 to the base of the npn-type transistor 61. The collector of the npn-type transistor 61 is connected to the base of the npn-type transistor 62 and also to the DC power supply voltage Vcc through resistor 64. The emitters of both npn-type transistors 61 and 62 are grounded. The collector of the npn-type transistor 62 is connected to the output of the comparator 22. As a result of this configuration, the npn-type transistor 62 is switched on when the output of comparator 21 is low, thus causing the output of comparator 22 to go low.

FIGS. 6A to 6D are timing charts used to describe the operation of the self-testing circuit 51 shown in FIG. 5. FIGS. 6A to 6D differ from FIGS. 3A to 3D in the output signal Vd of the comparator 22 and the output signal Ve of the low-pass filter consisting of the capacitor 26 and the resistor 32 shown by the waveform of FIG. 6D. The following description of the operation of the self-testing circuit 51 therefore focuses primarily on these differences.

In FIGS. 6A to 6D, a waveform (6A) represents the reference frequency signal Vin inputted to the input terminal Din of the self-testing circuit 51; a waveform (6B) represents the output signal Va of the comparator 21; a waveform (6C) represents the input signal Vb to the inverting input and the input signal Vc to the non-inverting input of comparator 22; and a waveform (6D) represents the output signal Vd of comparator 22 and the output signal Ve of the low-pass filter, i.e., the input signal to the common junction between the inverting input of the comparator 23 and the non-inverting input of the comparator 24.

As shown by the waveforms (6B) and (6D), when the output signal Va of the comparator 21 is low, the output signal Vd of the comparator 22 is also low. As a result, the signal level of the output signal Ve from the low-pass filter shown by the waveform of FIG. 6D drops, but the change in output signal Ve relative to the change in the frequency of the reference frequency signal Vin increases.

Therefore, in addition to achieving the benefits of the physical parameter sensor according to the first embodiment, the physical parameter sensor according the second embodiment of the present invention further succeeds in increasing the change in the duty cycle of the output signal of the comparator 22 in response to a change in the frequency of the reference frequency signal. The sensitivity of the frequency-voltage conversion circuit can therefore be increased, minute frequency changes in the reference frequency signal can also be detected, and the reliability of the physical parameter sensor can therefore be further increased.

Figure 7:
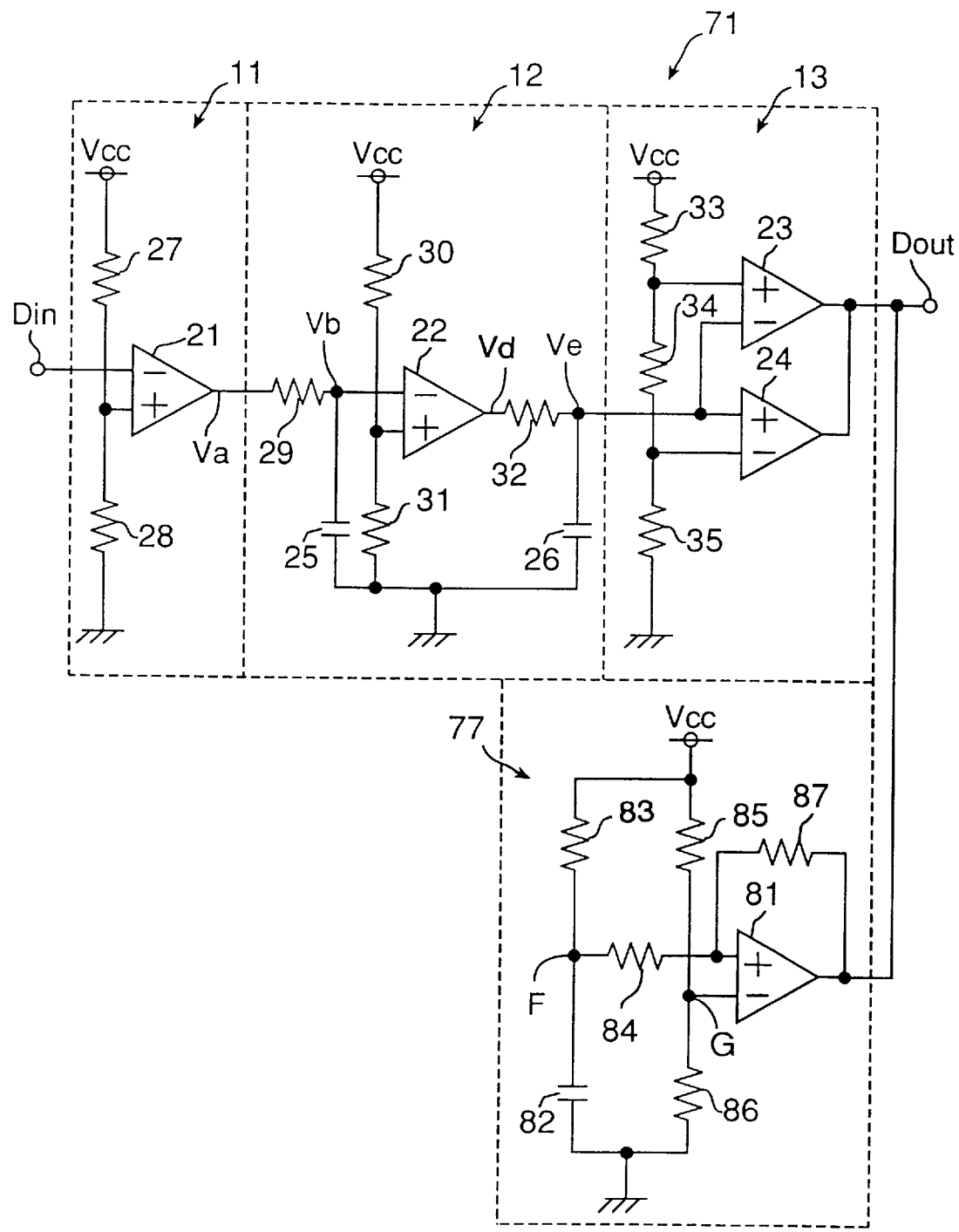
FIG. 7 is a circuit diagram of the self-testing circuit used in the physical parameter sensor according to a third embodiment of the present invention.

(Third Embodiment—FIG. 7)

According to any one of the first and second embodiments of the present invention, when the self-testing circuit detects the presence of an error in the reference frequency signal and subsequently outputs the error signal, that is, the high-level output signal Dout to the control circuit, the self-testing circuit requires the output signal Dout from the self-testing circuit to be forcibly rendered in a high level state at the time the sensor is powered on so that the control circuit can execute an operating test to determine whether a particular error detection process should be executed normally when the sensor is powered on. This is achieved in a physical parameter sensor according to a third embodiment of the present invention which will now be described with reference to FIG. 7.

A block diagram of the physical parameter sensor according to this third embodiment is substantially identical to that shown in FIG. 1 except that the physical parameter sensor is identified by 75 and the self-testing circuit is identified by 71. All other component parts are identified by the same reference numerals.

Referring now to FIG. 7, there is shown a circuit diagram of the self-testing circuit 71 used in the sensor according to this third embodiment. Note that this self-testing circuit 71 differs from that shown in FIG. 2 in that a power-on reset circuit 77 is employed.

As shown in FIG. 7, the power-on reset circuit 77 includes a comparator 81, a capacitance 82, and resistances 83 to 87. A series-connected circuit including series-connected resistance 83 and capacitance 82 is connected between the DC power supply voltage Vcc and ground, and a series-connected circuit including series-connected resistances 85 and 86 is connected parallel to the first series-connected circuit. A junction F between the resistance 83 and the capacitance 82 is connected through the resistance 84 to the non-inverting input of a comparator 81. A junction G between the resistances 85 and 86 is connected to the inverting input of the comparator 81. A resistance 87 is also connected between the non-inverting input and output of the comparator 81, and the output of the comparator 81 is connected to the output terminal Dout of the self-testing circuit 71.

In the circuit configuration shown n FIG. 7, the voltage VF at junction F rises based on the time constant of resistance 83 and capacitance 82 when the power is turned on. When this voltage VF exceeds a predetermined threshold voltage, specifically the voltage VG at junction G, the output of the comparator 81 goes high from low. Because the output of the comparator 81 is low before this level inversion, the voltage of the non-inverting input of the comparator 81 is (R87×VF)/(R84+R87) where R84 is the resistance of resistance 84 and R87 is the resistance of resistance 87.

The voltage at the non-inverting input after the output of the comparator 81 inverts from low to high is {VF+(Vcc−VF)×R84/(R84+R87)}. The resistance of resistors 84 and 87, and voltage VG, are therefore set so that the voltage of the non-inverting input of the comparator 81 may fluctuate considerably around voltage VG before and after the output of the comparator 81 changes from low to high.

It should be noted that the self-testing circuit including the power-on reset circuit thus described can also be employed in the physical parameter sensor according to the second embodiment of the present invention.

As hereinbefore described, by thus forcing the output terminal Dout to be high for a particular period of time when the power is turned on, the physical parameter sensor according to the third embodiment of the present invention is effective in that an operating test to determine whether the self-testing circuit is operating normally to detect an error in the reference frequency signal as part of the operating test routine run can be carried out when the power is turned on.
(Fourth Embodiment—FIGS. 8 to 10)

It should be noted that in the first through third embodiments described above the self-testing circuit detects an error in a reference frequency signal. The physical parameter sensor according to the present invention shall not be so limited, however, and can be so configured as to detect an error other than that in the reference frequency signal as described hereinafter in connection with the fourth embodiment of the invention.

Figure 8:
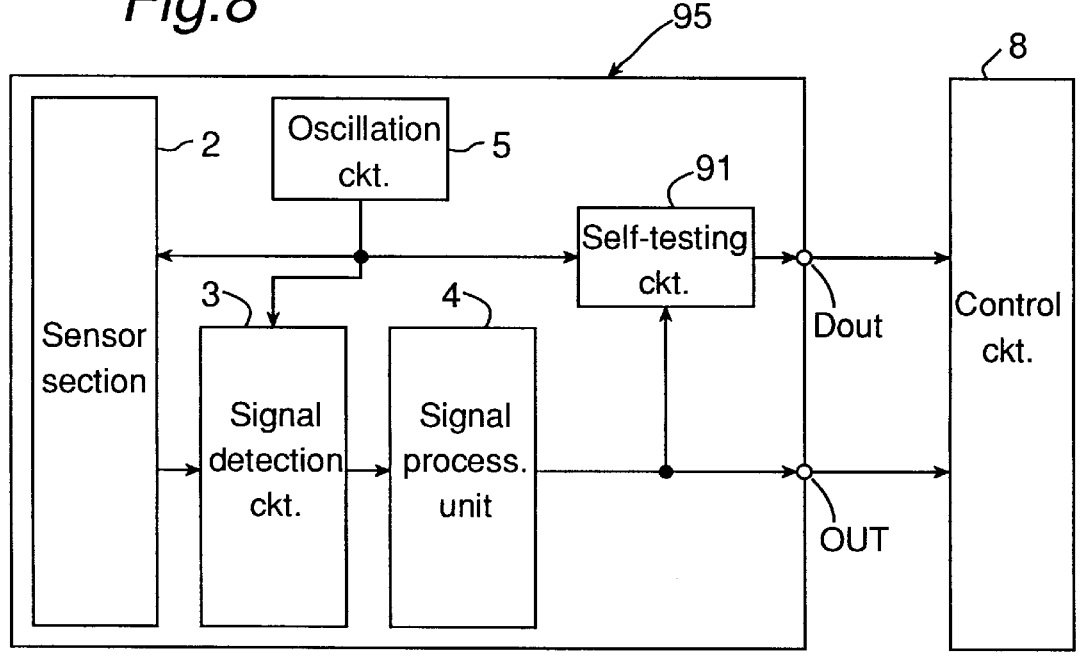
FIG. 8 is a block diagram of the physical parameter sensor according to a fourth embodiment of the present invention.

FIG. 8 is a block diagram of the physical parameter sensor according to the fourth embodiment of the present invention. It should be noted that the physical parameter sensor of this embodiment is described as operable based on the reference frequency signal in a manner similar to the angular velocity sensor.

The physical parameter sensor 95 shown in FIG. 8 differs from the physical parameter sensor 1 in FIG. 1 in that the self-testing circuit also monitors the voltage of the output terminal OUT of the physical parameter sensor and detects whether said voltage is within a particular voltage range. If the voltage of the output terminal OUT is not within said range, a signal indicating an error is outputted from the output terminal Dout. This self-testing circuit employed in the fourth embodiment of the present invention is identified by 91.

As shown in FIG. 8, the physical parameter sensor 95 includes a sensor circuit 2, signal detector 3, a signal processing circuit 4, an oscillation circuit 5, and the self-testing circuit 91. The oscillation circuit 5 is connected to the sensor circuit 2, signal detector 3, and self-testing circuit 91. The self-testing circuit 91 is further connected to the output of the signal processing circuit 4.

The output signal from the signal processing circuit 4 and the output signal from the self-testing circuit 91 are passed through the respective output terminals Dout and OUT of the physical parameter sensor 95 and is then supplied to the control circuit 8. The control circuit 8 may be a microcontroller or any other semiconductor device for implementing a particular process based on the signals inputted thereto from the physical parameter sensor 95.

The self-testing circuit 91 monitors the reference frequency signal outputted from the oscillation circuit 5 to detect whether the frequency of the reference frequency signal is within a particular range. The self-testing circuit 91 also monitors the voltage of the output signal from the signal processing circuit 4, and detects whether said voltage is within a particular range.

Figure 9:
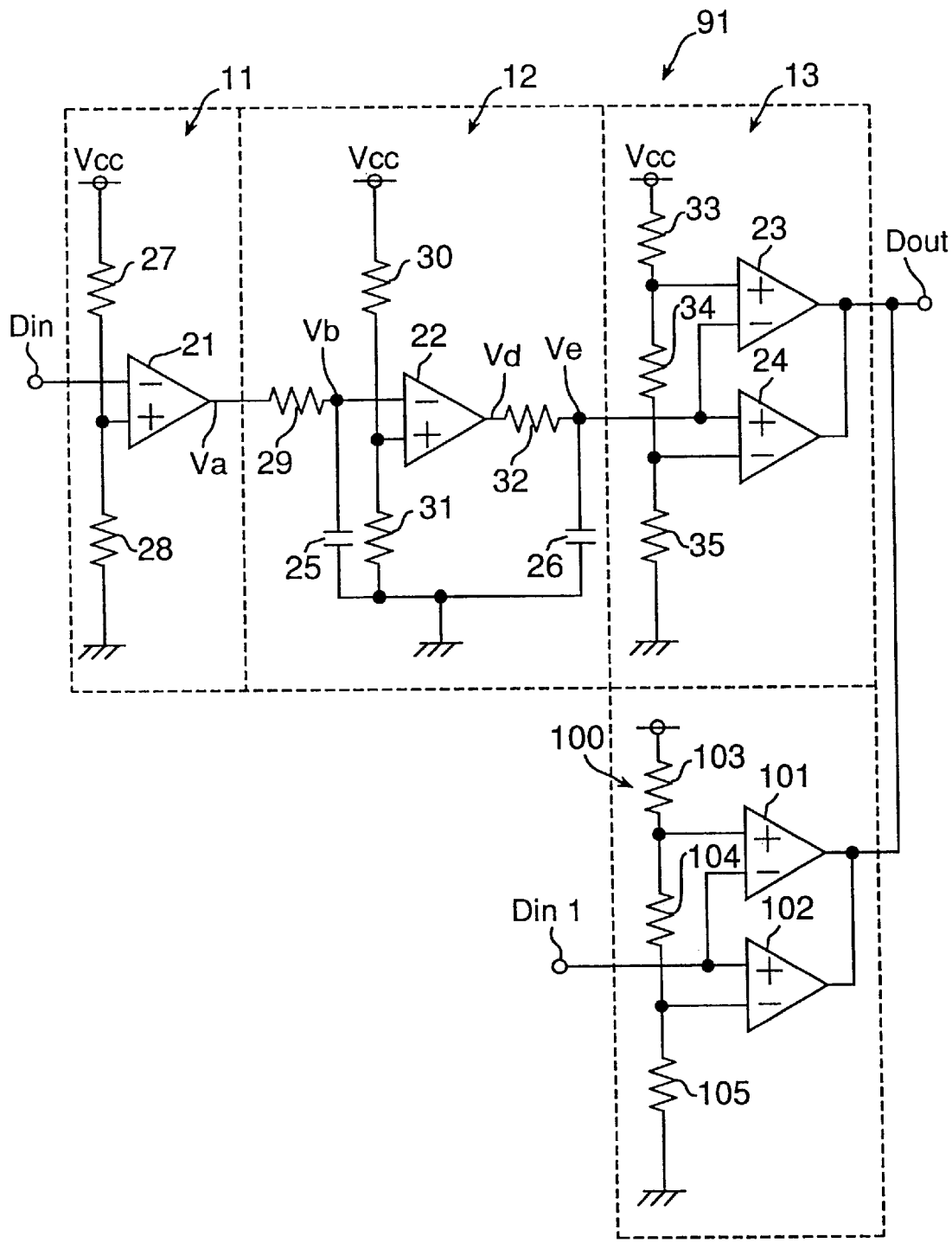
FIG. 9 is a circuit diagram of the self-testing circuit shown in FIG. 8.

FIG. 9 is a circuit diagram of the self-testing circuit 91 shown in FIG. 8. Note that this self-testing circuit 91 differs from that shown in FIG. 2 in that an output error evaluation circuit 100 for monitoring the output signal voltage from the signal processing circuit 4 is employed.

As shown in FIG. 9, the self-testing circuit 91 includes a wave shaping circuit 11, a frequency-voltage conversion circuit 12, an error determination circuit 13, and an output error evaluation circuit 100. The output error evaluation circuit 100 comprises comparators 101 and 102, forming a window comparator, and resistances 103 to 105.

A series-connected circuit of resistances 103 to 105 is connected between the DC power supply voltage Vcc and ground. The junction between the resistors 103 and 104 is connected to the non-inverting input of the comparator 101, and the junction between the resistor 104 and 105 is connected to the inverting input of the comparator 102. The inverting input of the comparator 101 and the non-inverting input of the comparator 102 are connected with each other and in turn with the input terminal Din1. Note that this input terminal Din1 is connected to the output of the signal processing circuit 4. The outputs of the comparators 101 and 102 are connected to a common line, which functions as the output of the output error evaluation circuit 100 and is connected to the output terminal Dout of the self-testing circuit 91.

If the output signal voltage from the signal processing circuit 4 inputted to the input terminal Din1 of the output error evaluation circuit 100 is within a particular threshold voltage range set by the resistances 103 to 105, the output from the output error evaluation circuit 100 is high, and the output signal level from the output terminal Dout of the self-testing circuit 91 is determined by the output signal of the error determination circuit 13. However, if the input voltage to the input terminal Din1 is not within said threshold voltage range, the output is low. This low output level causes an error signal to be outputted from the output terminal Dout to the control circuit 8. Note that in this embodiment a low level signal is used for this error signal.

When said error signal is inputted to the control circuit 8, the control circuit 8 ignores the signal inputted from the signal processing circuit 4, and executes a particular process associated with the detected error.

When a clamping circuit inside the control circuit 8 is connected to the output terminal OUT of the physical parameter sensor 95, the output terminal OUT voltage will always be within the threshold voltage range set by the output error evaluation circuit 100 even when an error occurs in the physical parameter sensor 95. In this case an error occurring before the amplifier circuit in the signal processing circuit 4 can be detected by the physical parameter sensor 95 by applying the temperature compensated signal from the signal processing circuit 4 to the input terminal Din1 before it is amplified.

It should be noted that the physical parameter sensor according to the present invention has been described as having the sensor circuit operating based on the reference frequency signal in a manner similar to the angular velocity sensor. As described below with reference to FIG. 10, however, the physical parameter sensor can also be comprised of the sensor circuit that does not operate based on a reference frequency signal.

Figure 10:
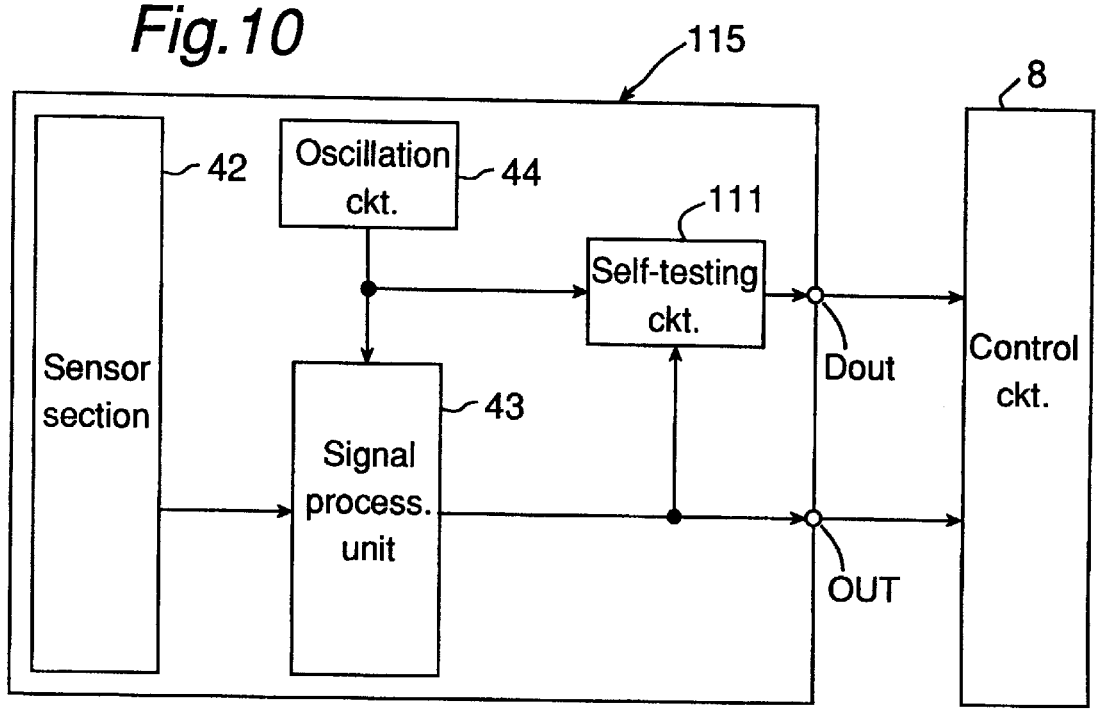
FIG. 10 is a block diagram of a modified form of the physical parameter sensor according to the fourth embodiment of the present invention.
Figure 11:
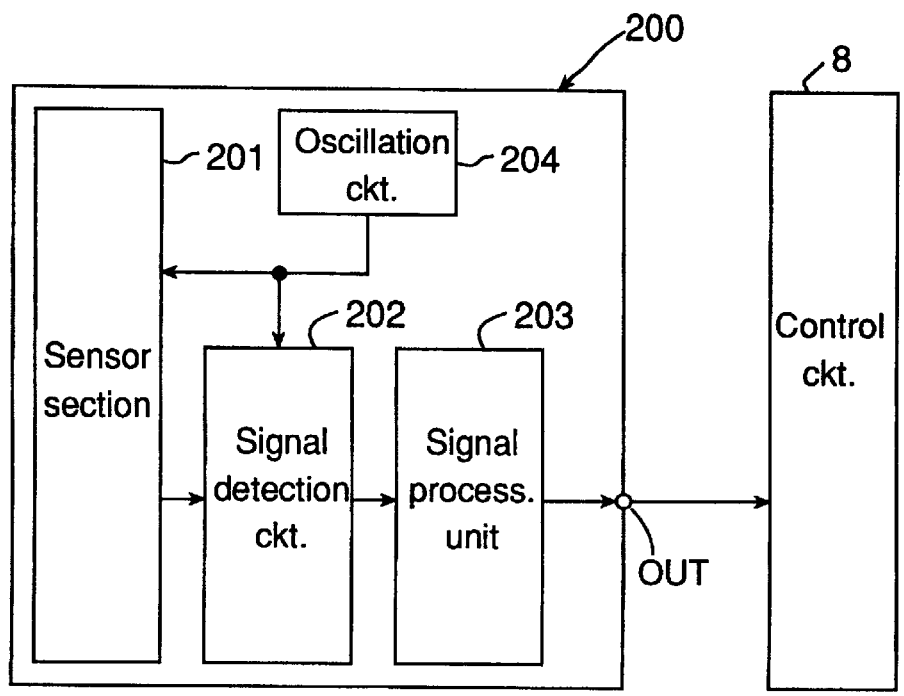
FIG. 11 is a block diagram of the prior art physical parameter sensor.

FIG. 10 is a block diagram of the physical parameter sensor according to a modification of the fourth embodiment shown in FIG. 9 above. As is the case with the acceleration sensor for detecting acceleration, the sensor circuit of the physical parameter sensor shown in FIG. 10 does not operate based on a reference frequency signal. Note that like parts in FIG. 4 and FIG. 10 are identified by like references, and further description thereof will not be reiterated for the sake of brevity.

The physical parameter sensor shown in FIG. 10 differs from that in FIG. 4 in that the self-testing circuit also monitors the voltage of the output terminal OUT of the physical parameter sensor, detects whether the output terminal OUT voltage is within a particular range, and outputs from the output terminal Dout a signal indicative of an error when the output terminal OUT voltage is not within said range. The physical parameter sensor 115 of this modification is therefore shown comprising self-testing circuit 111 in FIG. 10.

Referring to FIG. 10, the physical parameter sensor 115 includes a sensor circuit 42, a signal processing circuit 43, an oscillation circuit 44, and the self-testing circuit 111. The oscillation circuit 44 is connected to the signal processing circuit 43 and self-testing circuit 111, and the self-testing circuit 111 is further connected to the signal processing circuit 43.

The output signal from the signal processing circuit 43 and the output signal from the self-testing circuit 111 are passed through the respective output terminals OUT and Dout of the physical parameter sensor 41 to a control circuit 8. The control circuit 8 may be a microcontroller or any other semiconductor device for implementing a particular process based on the signals input thereto from the physical parameter sensor 115.

The self-testing circuit 111 monitors the reference frequency signal outputted from the oscillation circuit 44 to detect whether the frequency of the reference frequency signal is within a particular range, and detects whether the output signal voltage of the signal processing circuit 43 is within a particular range. Note that the design of the self-testing circuit 111 is substantially identical to the self-testing circuit 91 shown in FIG. 9, and therefore no further description thereof is reiterated for the sake of brevity.

When a clamping circuit inside the control circuit 8 is connected to the output terminal OUT of the physical parameter sensor 115, the output terminal OUT voltage will always be within the threshold voltage range set by the output error evaluation circuit 100 even when an error occurs in the physical parameter sensor 115. In this case an error occurring before the amplifier circuit in the signal processing circuit 4 can be detected by the physical parameter sensor 115 by applying the temperature compensated signal from the signal processing circuit 4 to the input terminal Din1 before it is amplified.

It should be noted that while the modification of the fourth embodiment has been described as applied to the first embodiment above, it will be obvious to those skilled in the art that similar application to any of the second and third embodiments above is also possible.

The physical parameter sensor according to the fourth embodiment of the present invention can thus detect an error in a reference frequency signal, and can further detect an error in the output signal of the physical parameter sensor itself. As a result, by thus detecting error other than error in the reference frequency signal, a physical parameter sensor according to the fourth embodiment of the present invention achieves a yet further improvement in operating reliability.

The invention having thus been described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A physical parameter sensor for detecting a physical parameter, comprising:

a sensor circuit for converting the physical parameter to an electric signal;

an oscillation circuit for generating and outputting a signal of a particular frequency;

a signal processing unit operating based on the signal output from the oscillation circuit, and applying a particular signal processing operation to the electric signal converted by the sensor circuit; and a self-testing circuit for monitoring a frequency of the signal output from the oscillation circuit, and outputting a particular error detection signal when the monitored frequency is detected to be out of a predetermined range of frequency.

2. The physical parameter sensor according to claim 1, wherein said sensor circuit is operably connected to said oscillation circuit and generates said electric signal based on the frequency of the reference signal from said oscillation circuit.

3. The physical parameter sensor according to claim 1, wherein said self-testing circuit comprises:

a wave shaping circuit for wave shaping the reference signal into a wave-shaped signal;

a frequency-voltage conversion circuit for converting the frequency of the wave-shaped signal to a DC voltage; and an error determination circuit for evaluating the presence of an error in the reference signal based on the DC voltage value determined by said frequency-voltage conversion circuit, and outputting the result of said evaluation.

4. The physical parameter sensor according to claim 3, wherein said frequency-voltage conversion circuit comprises:

a frequency-voltage conversion circuit for converting a frequency change of the wave-shaped signal to a duty cycle change in pulse width or pulse repetition rate of the wave-shaped signal; and a rectification circuit for rectifying a signal converted by said frequency conversion circuit.

5. The physical parameter sensor according to claim 4, wherein said wave shaping circuit shapes the reference signal from said oscillation circuit as a rectangular wave, and said frequency-voltage conversion circuit further comprises a circuit which forces the output of said frequency conversion circuit low when a signal level of the wave-shaped signal is low.

6. The physical parameter sensor according to claim 1, wherein said self-testing circuit further comprises a power-on reset circuit for outputting said error detection signal to indicate no error is present for a predetermined time when power is initially supplied to the physical parameter sensor.

7. The physical parameter sensor according to claim 1, wherein said self-testing circuit further comprises an output error detection circuit for monitoring the temperature-compensated output signal and outputting the particular error detection signal when an error in the temperature-compensated output signal is detected.

8. A parameter sensing method comprising:

transforming a physical parameter to an electric signal;

generating an oscillation signal at a particular frequency;

processing the electric signal based on the oscillation signal; and monitoring a frequency of the oscillation signal, and outputting a particular error detection signal when the monitored frequency is detected to be out of a predetermined range of frequency.

9. The method of claim 8, further comprising a step of converting the electrical signal into a direct current (DC) signal as the derivative signal.

10. The method of claim 8, wherein said monitoring step comprises:

shaping the oscillation signal;

converting the shaped oscillation signal to a DC voltage; and evaluating the DC voltage to detect the error state.

11. The method of claim 10, wherein said converting step converts a frequency change in the shaped oscillation signal to a change in duty cycle by altering pulse width or pulse repetition rate in response to the frequency change to form a converted result, and rectifying the converted result.

12. The method of claim 10, wherein said shaping step generates a rectangular wave, and said converting step generates a low level signal when the level of the rectangular wave is low.

13. The method of claim 8, wherein said monitoring step outputs the error detection signal indicating the absence of the error state for a predetermined time after applying electrical energy to the sensor.

14. The method of claim 8, wherein said monitoring step further monitors the processed signal of said processing step and outputs an error detection signal when an error in the processed signal with respect to a benchmark signal value is detected.

* * * * *